United States Patent
Shie

(10) Patent No.: US 7,247,542 B2
(45) Date of Patent: Jul. 24, 2007

(54) FABRICATION METHOD OF SPIRAL INDUCTOR ON POROUS GLASS SUBSTRATE

(75) Inventor: Jin Shown Shie, Hsinchu (TW)

(73) Assignee: Integrated Crystal Technology, Inc. (TW)

( * ) Notice: Subject to any disclaimer, the term of this patent is extended or adjusted under 35 U.S.C. 154(b) by 128 days.

(21) Appl. No.: 11/201,868

(22) Filed: Aug. 10, 2005

(65) Prior Publication Data

US 2007/0034910 A1 Feb. 15, 2007

(51) Int. Cl.
*H01L 21/20* (2006.01)
(52) U.S. Cl. .............. 438/381; 257/531; 257/277; 257/E21.022
(58) Field of Classification Search ........ 257/277; 438/381
See application file for complete search history.

(56) References Cited

U.S. PATENT DOCUMENTS 6,351,010 B1 * 2/2002 Yamanaka et al. .......... 257/350

* cited by examiner

*Primary Examiner*—Thao X. Le
*Assistant Examiner*—Mohammad Ghazzawi
(74) *Attorney, Agent, or Firm*—Perkins Coie LLP

(57) ABSTRACT

The present invention discloses a fabrication method and structure of spiral RF inductor on porous glass substrate. Thick porous silicon layer is natively formed on a silicon wafer by anodic etching the silicon material to a high degree of porosity. The porous silicon is than thermally oxidized at high temperature converting it into porous glass texture. The oxidation rate can be rapid due to open pore character of the etched structure, which allows oxidizing agents to penetrate deeply into the wafer. If the porosity is large enough, the pores will not be sealed by the expansion of oxide during the oxidation, which results a porous structure of glass-and-air mixture of low relative dielectric constant slightly over a value of 2. The final holes appear on the wafer surface can be sealed by CVD coating step, if necessary. This ultra-flat, low-k, silicon-based substrate allows RF spiral inductor to be made on its surface with excellently low loss, or high Q value.

4 Claims, 4 Drawing Sheets

FABRICATION METHOD OF SPIRAL INDUCTOR ON POROUS GLASS SUBSTRATE

BACKGROUND OF THE INVENTION

1. Field of the Invention

The present invention relates to a spiral RF inductor. In particular, the present invention relates to a spiral RF inductor on low k substrate formed on a silicon wafer to give low k, low loss and high Q value.

2. Description of the Related Art

Microwave inductor is always produced by forming a spiral on a ceramic substrate of aluminum oxide content (~96%),or a glass (silicon dioxide) substrate with k value of 7.8 and 3.9, respectively with screen printing technique. These substrates can not use the existing silicon process micro fabrication equipments. FIG. 1 is a cross sectional structure of a conventional spiral chip inductor of the prior art. An alumina ceramic substrate 102 is a square type substrate. By using screen printing, a Ti or Ni Pattern of the first layer of the spiral is formed on the surface. Then a first layer of the spiral 106 is formed by copper plating. A layer of silicon dioxide or USG (un-doped silicon glass) is deposited on the substrate 102 to form an insulating layer 104. Next, a via-106 hole 108 is opened and a copper layer is formed by plating. Last, by lithography, form the crossover copper and a second layer of the spiral pattern.

This process makes use of screen printing or contact aligner to form the pattern of Ti, Ni or copper. The equipment is not accurate enough, so that the value of inductance will be changed from wafer to wafer, even chip to chip. Thus the frequency response can be affect by the spiral inductor.

The other disadvantage of the prior art is that the dielectric under the first and second layer of the spiral are alumina and silicon dioxide, respectively, which have higher dielectric constant of 7.8 and 3.9, the quality factor (Q) of the spiral is low.

Another disadvantage of the prior art is that the ceramic or glass substrate is very hard and can not be thinned by lapping, so that it is not suitable for handy device such as cellular phone, which has thinner spiral inductors.

In the U.S. Pat. No. 6,153,489 to Min Park et al., a trench-shaped silicon porous 19 is formed under the inductor, the parasitic capacitance between metal lines 16 and the silicon substrate 10 is decreased. However, the second dielectric layer 14 between the metal lines 16 and the first metal level 13 is still high. In the U.S. Pat. No. 6,287,936 to Ernesto Perea et al., using electroplating to form a porous silicon on the rear face FAR to a thickness of H2. Although the porous silicon is very thick, the thickness of h2 is very hard to control and the dielectric between the metal spiral ML and the first metal level is also still high.

There is a need for fabricating a spiral inductor with higher quality factor and can be thinned by lapping, thus smaller and finer chip inductors can be produced.

OBJECTS OF THE INVENTION

It is therefore an object of the invention to provide an RF chip inductor by fabrication the spiral inductor on a silicon wafer as the initial material instead of ceramic substrate for cost effective reason.

The other object of the invention is to provide an RF chip inductor by fabrication the spiral inductor on a low k porous layer to give excellent low loss and high Q inductor.

Another object of the invention to provide an RF chip inductor by using the high flatness of silicon wafers allow the use of precision lithographic equipments to define finer and precision inductors as compared with e screen printing or contact aligner.

It is yet a further object of the invention to provide an RF chip inductor by using high-productivity lapping equipments are allowed thinning the silicon wafer to 100 micron range, meeting the current industrial demand of handy electronic equipments, such as mobile phone set.

DISCLOSURE OF THE INVENTION

A first aspect of the present invention teaches a Structure of RF chip inductor. Includes a P-type silicon wafer, with a layer of N-type silicon film on the back side, a thick porous glass, formed on the front side of the P-type silicon wafer, and A spiral inductor, formed on the porous glass to give low k, low loss and high Q inductor.

Another aspect of the present invention teaches a fabrication method of RF chip inductor, fabricating on porous glass substrate to give low k, low loss and high Q inductor, is described in the following steps: Step 1, a P-type silicon wafer is used as the substrate; Step 2, an N-type silicon film is formed on the back side of the substrate by implanting; Step 3, a porous silicon layer, formed by electrochemical etching in hydrogen fluoride (HF) solution to a high degree of porosity; Step 4, a porous glass layer, thermally oxidizing at high temperature to convert said porous silicon layer into porous glass texture; Step 5, a thin layer of electrically conductive metal film is deposited on the porous glass to be the plating electrode of copper plating; Step 6, a first layer of photo-resist is spun on the front side of said silicon wafer; a mask process is adopted for patterning to said first layer photo-resist and formed openings for the under layer of a spiral inductor; Step 71, a layer of copper is electroplated on the wafer surface complementary to said openings; the photo-resist is stripped away; the electrically conductive metal film is etched out in hydrogen peroxide; Step 8, a cover layer of polyimide is spun on the surface and a second mask process is taken for patterning the cover polyimide to define the contact via; Step 9, another electrically conductive metal film is deposited on said cover layer of polyimide and said contact via to be the plating electrode of copper plating; Step 10, a second layer of photo-resist is spun on the front side of the silicon wafer; a mask process is adopted for patterning said photo-resist and form opening for the second layer of the spiral inductor. Step 11, a second layer of copper is electroplated on the top to a thickness of the inductor strip; the photo-resist is stripped away; the electrically conductive metal film is etched out in hydrogen peroxide; Step 12, a thin layer of gold is plated to the exposed copper surface by electro-less plating to protect the inductor surface.

The advantage of the present method are: (1) The substrate is low k, For a 70% porosity of porous silicon, the porous glass will be double in volume, which results in 60 to 40 volume ratio of glass and air, with a k value of 2.74 is expected, compared to 3.9 of glass and 7.8 of alumina. Therefore high Q inductor is achievable; (2) The spiral inductor can smaller and finer, the silicon wafer can be processed utilizing the existing micro-fabrication equipments, therefore smaller and finer chip inductors can be produced. This will increase the yield per wafer and lowering the cost. (3) The substrate is thinner and suitable for handy device; the silicon wafer can be thinned down by lapping the un-etched part, which could result in thickness around 100 microns, much less than the conventional ceramic substrate.

BRIEF DESCRIPTION OF THE DRAWINGS

The foregoing and other advantages of the invention will be more fully understood with reference to the description of the best embodiment and the drawing wherein.

DESCRIPTION OF THE PREFERRED EMBODIMENTS

Figure 1:
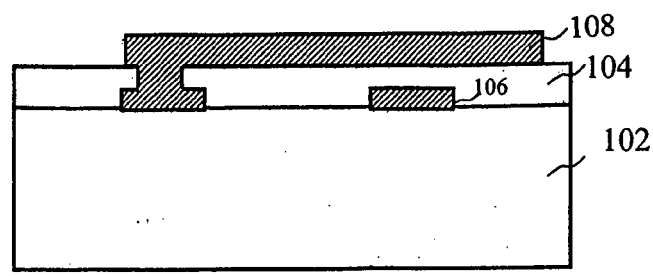
FIG. 1 is a cross sectional structure of a conventional spiral chip inductor of the prior art.
Figure 2:
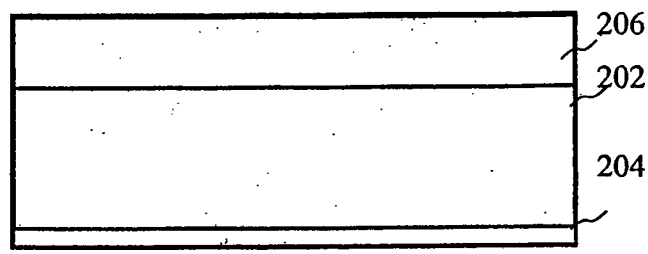
FIG. 2 is a schematic representation of the fabrication steps in accordance to one embodiment of the present invention.
Figure 2:
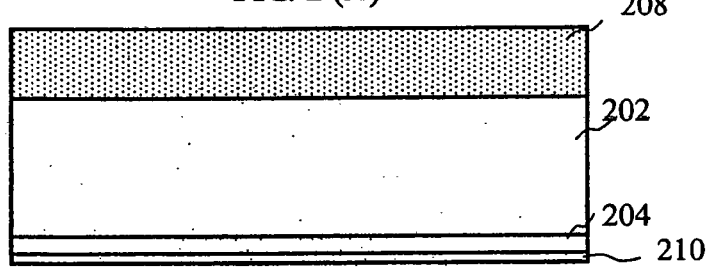
Figure 2:
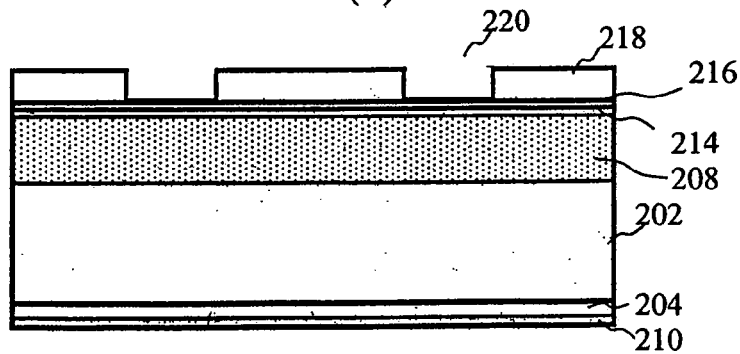

FIG. 2 is a schematic representation of the fabrication steps in accordance to one embodiment of the present invention. Refer to FIG. 2(A), the process begin with a P-type silicon wafer 202, forming an N-type layer 204 on the back side of the P-type silicon wafer 202 for protect the back side in porous formation. Then the P-type silicon wafer 202 is electrochemical etching in hydrogen fluoride acid (HF) solution to produce a thick porous silicon layer 206 of high porosity. The back is not etched since there is an N-type layer 204 which is not etched by the HF solution.

Figure 2D:
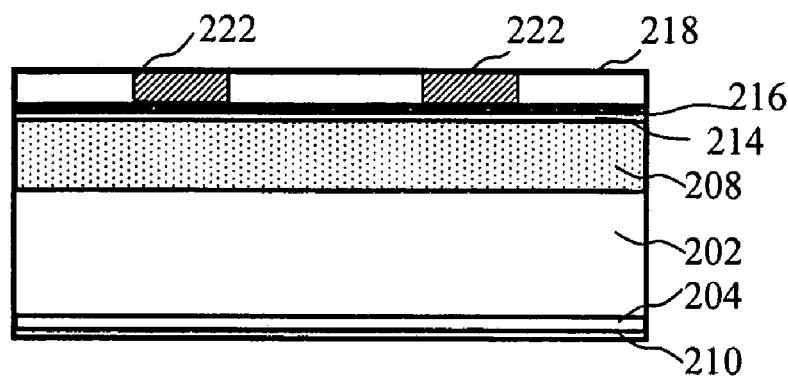

Refer to FIG. 2(B), the silicon wafer 202 is treated with thermal oxidation in high temperature oven. The open pores in the porous silicon layer allow the oxidation agent to penetrate through and convert the porous silicon material into native silicon dioxide glass 208 by oxidation. For high porous structure the pore will maintain open and ventilating to oxidation gas; without being sealed by volume expansion of the oxide during the reaction. The back side also grows a thin native oxide 210 on the N-type layer 204 during porous formation. Optionally, the porous glass surface can be subjected to a thin passivation layer 212 (see FIG. 2(C)) of insulation coating for pore coverage and planerization. The processed substrate has a surface layer of oxide-air mixture which has a combined dielectric constant of the two compositions. And because of air has relative unit permittivity, this combined structure has low k characteristics, which most suitable as a substrate making inductive element. Spiral inductor can be fabricated on the low k porous glass as the conventional one using alumina ceramic substrate, as described bellow:

Refer to FIG. 2(C), a thin layer of Ti 214 and W 216 of 100 nm to 1000 nm, or other suitable electrically conductive metal film, is deposited on the porous glass to be the plating electrode of copper plating, then a thick layer of photo-resist 218 is spun on the front side of the silicon wafer. The thickness of the photo-resist 218 is comparable to the requirement for the thickness of the inductor strip. Then a mask process is adopted for patterning the front side thick layer of photo-resist 218 and form openings 220, Refer to FIG. 2(D), a layer of copper 222 is electroplated on the wafer surface complementary to the openings 220 with the thickness comparable to the photo-resist 218.

Figure 2E:
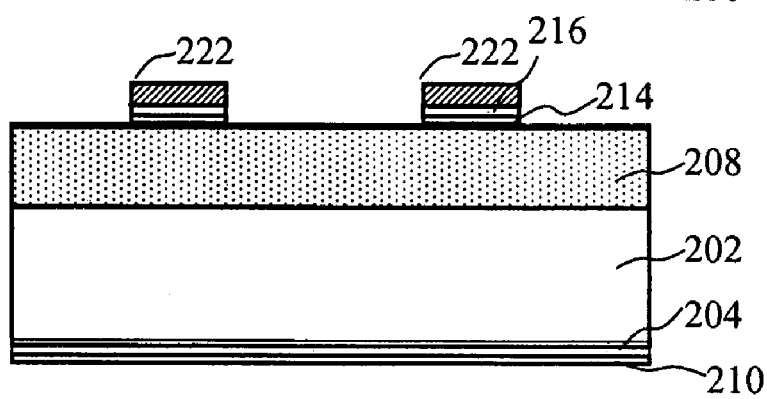

Refer to FIG. 2(E), the photo-resist 218 is stripped away and the Ti/W layers 214, 216 are etched out in hydrogen peroxide.

Figure 2F:
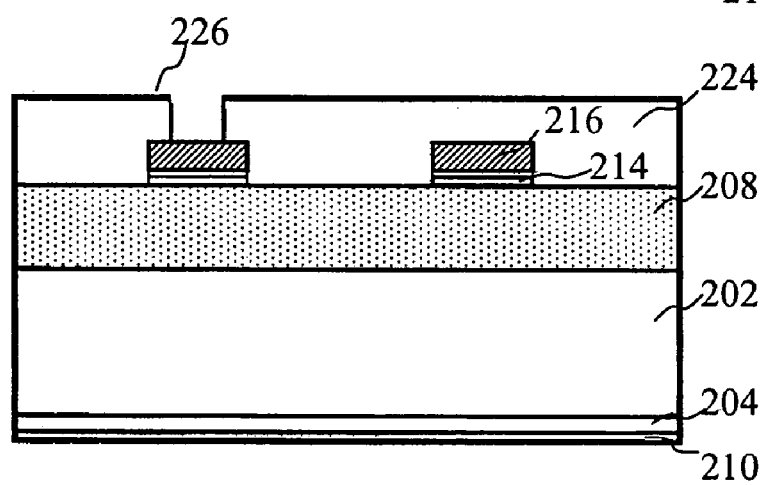

Refer to FIG. 2(F), a cover layer of polyimide 224 is spun on the surface and a second mask process is taken for patterning the cover polyimide 224 to define the contact via 226.

Figure 2G:
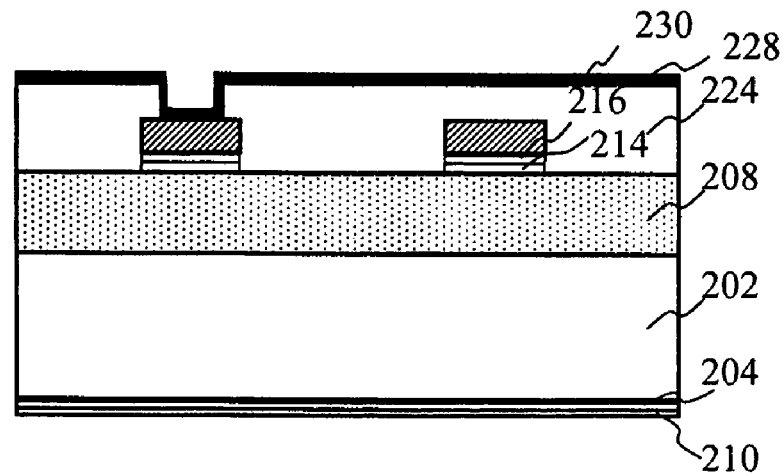

Refer to FIG. 2(G), a thin layer of Ti 228 and W 230 of 100 nm to 1000 nm, or other suitable electrically conductive metal film, is deposited on the cover layer of polyimide 224 and the contact via 226 to be the plating electrode of copper plating to connect the under layer and upper layer of the spiral inductor.

Figure 2H:
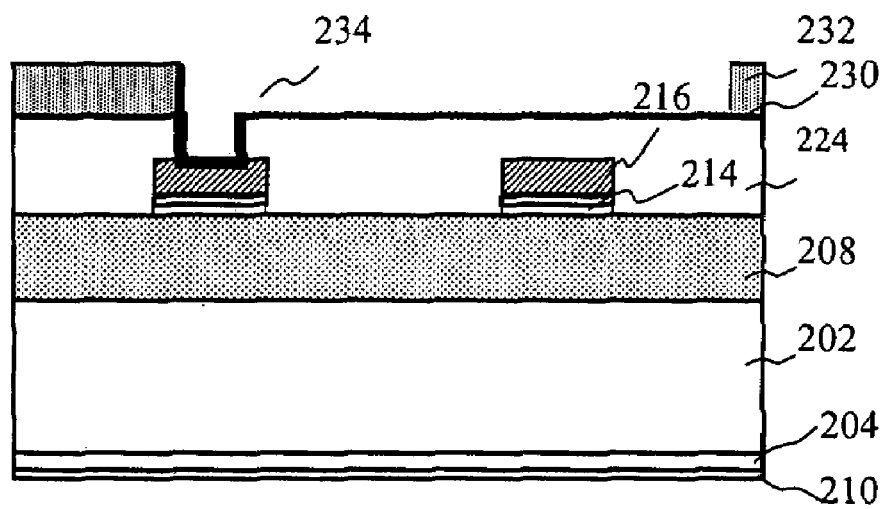

Refer to FIG. 2(H), a thick layer of photo-resist 232 is spun on the front side of the silicon wafer. The thickness of the photo-resist 232 is comparable to the requirement for the thickness of the inductor strip. Then a mask process is adopted for patterning the photo-resist 232 and form opening 234 for the second layer of the spiral inductor.

Figure 2I:
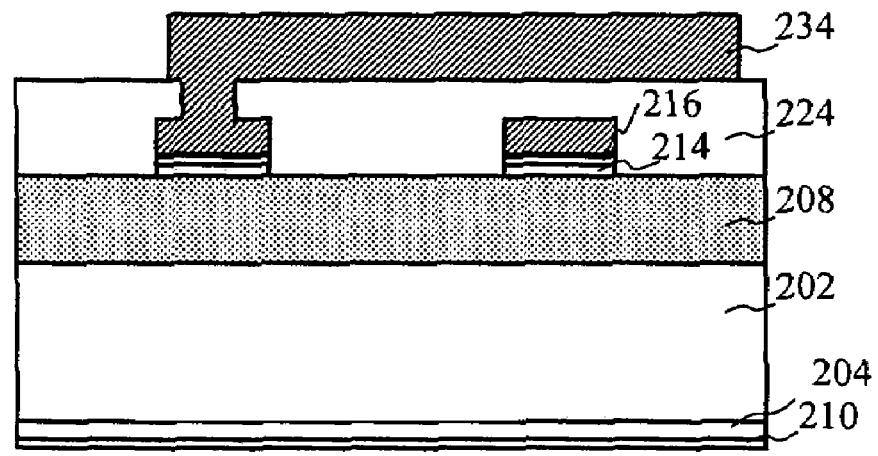

Refer to FIG. 2(I), another layer of copper 234 is electroplated on the top to a thickness of the inductor strip. Then the photo-resist 232 is stripped and Ti/W is also stripped in hydrogen peroxide.

Figure 2J:
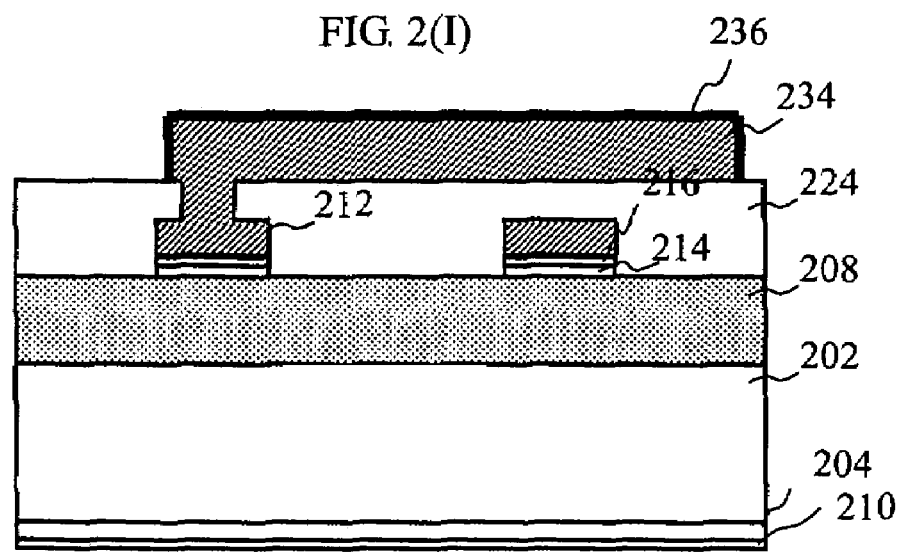

Finally, Refer to FIG. 2(J), a thin layer of gold 236 is plated to the exposed copper surface by electro-less plating to protect the inductor surface. The manufacturing process is then completed.

Figure 3:
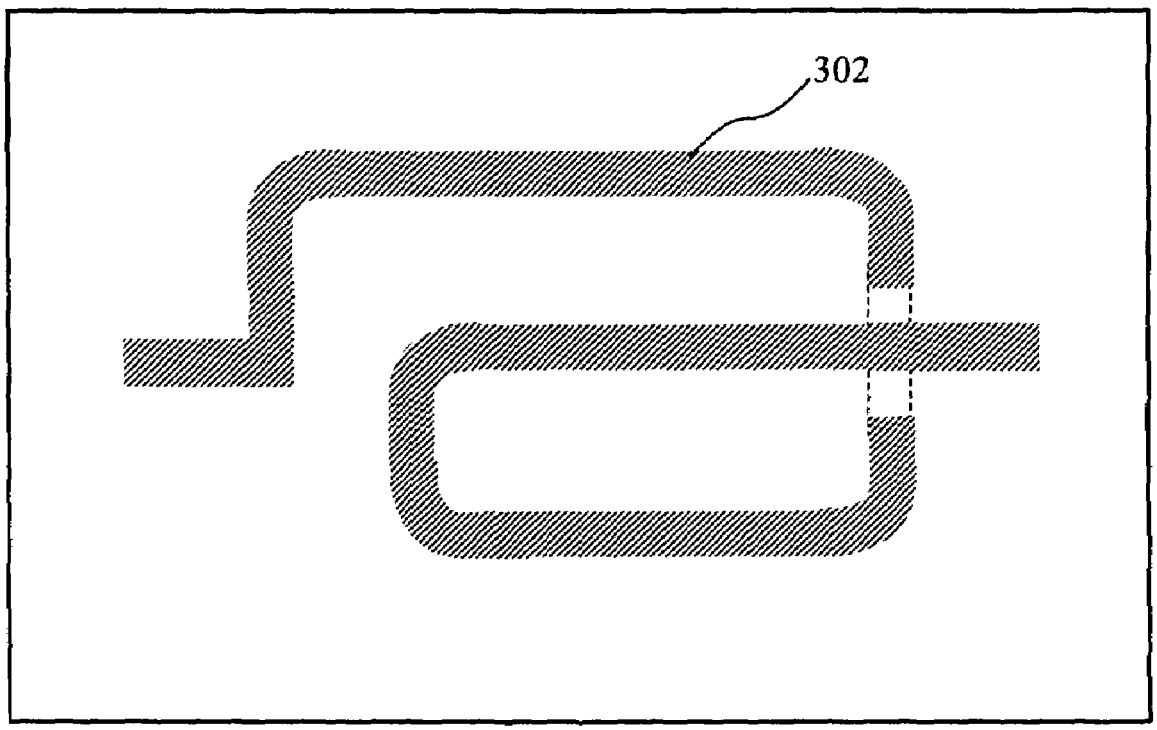
FIG. 3 illustrates the top view of a spiral inductor in according to one embodiment of the present invention.

FIG. 3 illustrates the top view of a spiral inductor in according to one embodiment of the present invention.

Although specific embodiments of the invention have been disclosed, it will be understood by those having skill in the art that minor changes can be made to the form and details of the specific embodiments disclosed herein, without departing from the spirit and the scope of the invention. The embodiments presented above are for purposes of example only and are not to be taken to limit the scope of the appended claims.

What is claimed is:

1. A fabrication method of RF chip inductor, fabricating on porous glass substrate to give low k, low loss and high Q inductor, comprising the following steps:

a P-type silicon wafer is used as the substrate;

an N-type silicon film is formed on the back side of the substrate by implanting;

a porous silicon layer, formed by electrochemical etching in hydrogen fluoride (HF) solution to a high degree of porosity;

a porous glass layer, thermally oxidizing at high temperature to convert said porous silicon layer into porous glass texture;

a thin layer of electrically conductive metal film is deposited on the porous glass to be the plating electrode of copper plating;

a first layer of photo-resist is spun on the front side of said silicon wafer; a mask process is adopted for patterning to said first layer photo-resist and formed openings for the under layer of a spiral inductor;

a layer of copper is electroplated on the wafer surface complementary to said openings; the photo-resist is stripped away; the electrically conductive metal film is etched out in hydrogen peroxide;

a cover layer of polyimide is spun on the surface and a second mask process is taken for patterning the cover polyimide to define the contact via;

another electrically conductive metal film is deposited on said cover layer of polyimide and said contact via to be the plating electrode of copper plating;

a second layer of photo-resist is spun on the front side of the silicon wafer; a mask process is adopted for patterning said photo-resist and form opening for the second layer of the spiral inductor;

a second layer of copper is electroplated on the top to a thickness of the inductor strip; the photo-resist is stripped away; the electrically conductive metal film is etched out in hydrogen peroxide;

a thin layer of gold is plated to the exposed copper surface by electro-less plating to protect the inductor surface.

2. A fabrication method as recited in claim 1, wherein said electrically conductive metal is titanium (Ti)/tungsten (W).

3. A fabrication method as recited in claim 1, wherein the thickness of said electrically conductive metal film is 100 nm to 1000 nm.

4. A fabrication method as recited in claim 1, wherein the thickness of said photo-resist is the same as the thickness of the inductor strip.

* * * * *